(12) United States Patent
Sutardja

(10) Patent No.: US 8,659,144 B1
(45) Date of Patent: Feb. 25, 2014

(54) POWER AND GROUND PLANES IN PACKAGE SUBSTRATE

(71) Applicant: Marvell International Ltd., Hamilton (BM)

(72) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/717,375

(22) Filed: Dec. 17, 2012

Related U.S. Application Data

(60) Provisional application No. 61/576,319, filed on Dec. 15, 2011.

(51) Int. Cl.
*H01L 23/52* (2006.01)
*H01L 23/48* (2006.01)

(52) U.S. Cl.
USPC ............. 257/691; 257/697; 257/E23.015; 257/E23.024; 257/E23.067; 257/E23.079; 257/E23.153

(58) Field of Classification Search
USPC ............. 257/691, 697, E23.015, E23.024, 257/E23.067, E23.079, E23.153
See application file for complete search history.

(56) References Cited

U.S. PATENT DOCUMENTS

| | | | | | |
|---|---|---|---|---|---|
| 4,302,625 | A | * | 11/1981 | Hetherington et al. | 174/264 |
| 5,835,357 | A | * | 11/1998 | Swamy et al. | 361/764 |
| 6,037,044 | A | * | 3/2000 | Giri et al. | 428/209 |
| 6,078,068 | A | * | 6/2000 | Tamura | 257/203 |
| 6,924,678 | B2 | * | 8/2005 | Starr | 327/147 |
| 7,725,858 | B2 | * | 5/2010 | Tan | 716/119 |
| 7,745,922 | B2 | * | 6/2010 | Lee | 257/691 |
| 8,536,695 | B2 | * | 9/2013 | Liu et al. | 257/700 |
| 8,549,447 | B2 | * | 10/2013 | Eisenstadt | 716/100 |
| 2006/0038272 | A1 | * | 2/2006 | Edwards | 257/686 |
| 2007/0296441 | A1 | * | 12/2007 | Whetsel | 324/763 |
| 2011/0278739 | A1 | * | 11/2011 | Lai et al. | 257/777 |
| 2012/0106117 | A1 | * | 5/2012 | Sundaram et al. | 361/808 |

* cited by examiner

*Primary Examiner* — Ida M Soward

(57) ABSTRACT

A semiconductor package includes a plurality of electrical connectors, a semiconductor die having core logic, at least two pairs of core logic input-power and output-power pads, and a plurality of input/output signal pads that carry signals to and from the core logic. Each pad of the semiconductor die has an electrical connector of the plurality of electrical connectors extending therefrom. The semiconductor package also includes a package substrate having at least two pairs of input-power and output-power contact pads, a plurality of input/output signal contact pads, a first metal redistribution layer, and a second metal redistribution layer. The first metal redistribution layer provides a first electrical potential to each of the input-power contact pads, and the second metal redistribution layer provides a second electrical potential to each of the output-power contact pads. Each contact pad has an electrical connector of the plurality of electrical connectors extending therefrom.

7 Claims, 3 Drawing Sheets

POWER AND GROUND PLANES IN PACKAGE SUBSTRATE

CROSS REFERENCE TO RELATED APPLICATIONS

This disclosure claims priority to U.S. Provisional Patent Application No. 61/576,319, filed on Dec. 15, 2011, which is incorporated herein by reference.

TECHNICAL FIELD

Implementations of the present disclosure relate generally to the field of integrated circuits, and more particularly to techniques, structures, and configurations for providing power to integrated circuits in a package.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An integrated circuit (also commonly referred to as IC, chip, or microchip) is an electronic circuit manufactured by a patterned diffusion of trace elements into the surface of a thin substrate of semiconductor material (e.g., a semiconductor die). One example of an integrated circuit chip is a system on a chip (SOC). An SOC typically integrates all components of a computer or other electronic system into a single chip. For example, an SOC can contain digital, analog, mixed-signal, and radio-frequency functions—all on a single chip substrate.

Integrated circuit devices, such as transistors, are formed on semiconductor dies having features that continue to scale in size to smaller dimensions. The shrinking dimensions of these features are challenging conventional routing configurations of power signals and/or ground signals for semiconductor dies in an electronic package assembly (or semiconductor package). For example, the routing of power signals and/or ground signals using conventional pin technologies for multiple semiconductor dies in the same semiconductor package may considerably increase manufacturing cost of the semiconductor package. In general, a semiconductor package is a metal, plastic, glass, or ceramic casing containing one or more semiconductor components (e.g., one or more semiconductor dies). Individual discrete components are typically etched in a silicon wafer before being cut and assembled in a semiconductor package. A semiconductor package generally i) provides protection against impact and corrosion, ii) holds contact pins or leads which are used to connect circuits internal to the semiconductor package to circuits external to the semiconductor package, and iii) dissipates heat produced in the semiconductor package.

A conventional semiconductor die includes a first redistribution layer (RDL) and a second redistribution layer for providing a first electrical potential (e.g., VDD) and a second electrical potential (e.g., ground) to the entire conventional semiconductor die, where an RDL layer is comprised of an electrical conductor that provides an electrical potential to multiple components, devices, circuits. A conventional RDL layer may have surface area dimensions that are approximately equal to the surface area dimensions of the conventional semiconductor die.

SUMMARY

In an embodiment, the present disclosure provides a semiconductor package comprising a plurality of electrical connectors and a semiconductor die having core logic, at least two pairs of core logic input-power, output-power pads that provide power to the core logic, and a plurality of input/output signal pads that carry signals to and from the core logic. Each core logic input-power pad and core logic output-power pad, and each input signal pad and output signal pad, has an electrical connector of the plurality of electrical connectors extending therefrom. The semiconductor package also comprises a package substrate configured to provide power to the core logic of the semiconductor die. The package substrate has at least two pairs of input-power and output-power contact pads, a plurality of input/output signal contact pads, a first metal redistribution layer, and a second metal redistribution layer. The first metal redistribution layer provides a first electrical potential to each of the input-power contact pads, and the second metal redistribution layer provides a second electrical potential to each of the output-power contact pads. Each contact pad has an electrical connector of the plurality of electrical connectors extending therefrom.

In a further embodiment, the present disclosure provides, a package substrate comprising a plurality of input and output signal contact pads, at least two pairs of input-power and output-power contact pads, and a first metal redistribution layer and a second metal redistribution layer. The first metal redistribution layer provides a first electrical potential to each of the input-power contact pads, and the second metal redistribution layer provides a second electrical potential to each of the output-power contact pads.

The details of one or more implementations are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION

The present disclosure describes techniques, structures, and configurations for implementing a package substrate to supply power to logic components of a semiconductor die within a semiconductor package.

Figure 1:
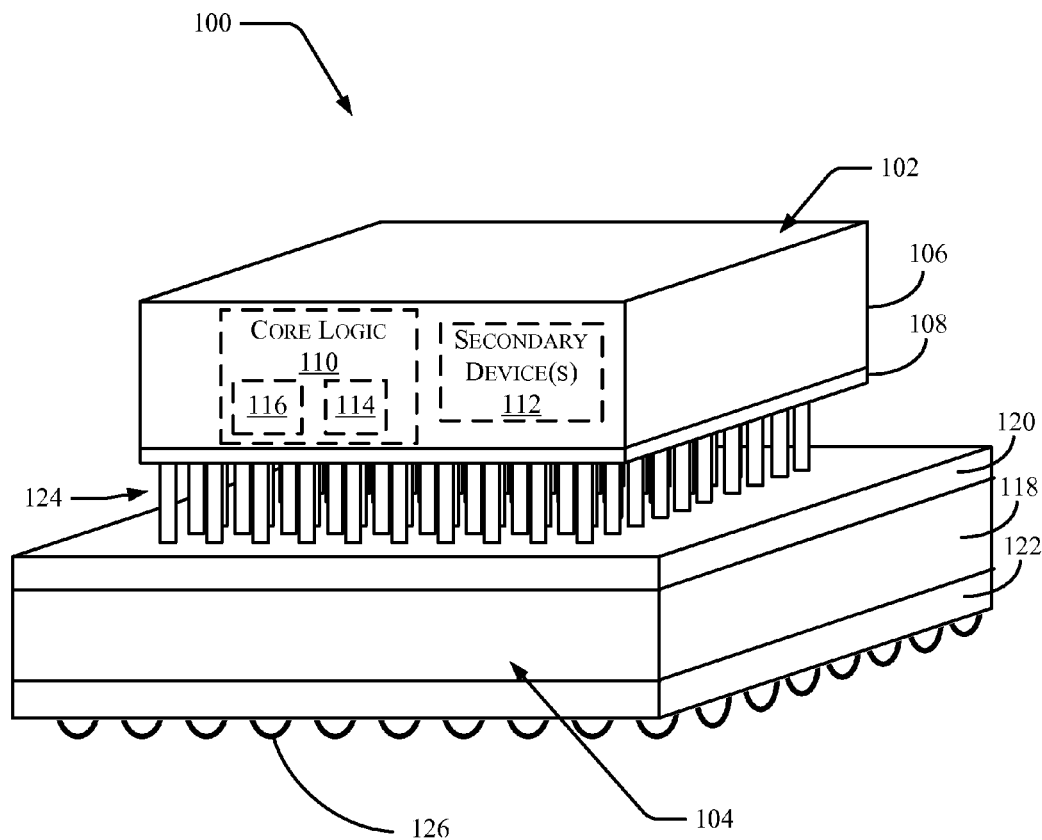
FIG. 1 is an isometric view of a semiconductor package in accordance with one implementation.

FIG. 1 illustrates an isometric view of a semiconductor package 100 having a semiconductor chip 102 and a package substrate 104.

The semiconductor chip 102 includes a semiconductor die 106 and one or more build-up layers 108, and the semiconductor die 106 includes core logic 110 and may include one or more secondary devices 112. Core logic 110 may include logic components 114 and 116, which may be, among other things, processors, central processing unit(s) (CPUs), graphical processing unit(s) (GPUs) and other devices and/or circuitry that consume relatively high levels of electrical power. The secondary device 112 may include a device or devices and/or circuitry such as, but not limited to, electrostatic discharge devices that, under normal conditions, consume relatively lower levels of electrical power, compared with the components of core logic 110.

The package substrate 104 includes a substrate core 118, one or more build-up layers 120 formed on a first surface of the substrate core 118, and one or more build-up layers 122 formed on a second surface of the substrate core 118.

A plurality of electrical connectors 124 extend between the build-up layers 108 of the semiconductor chip 102 and the build-up layers 120 of the package substrate 104. The plurality of electrical connectors 124 may be pillars or bumps and may have a pitch, or distance between the pillars or bumps, in the range of 50 microns to 200 microns. The electrical connectors 124 may be formed from aluminum (Al), aluminum-copper alloy, copper (Cu), or nickel (Ni), gold (Au), silver (Ag), or another suitable material that is known for electrical conductive properties.

The semiconductor chip 102 and the package substrate 104 are configured such that electrical power is conveyed between the semiconductor chip 102 and the package substrate 104 through the plurality of the electrical connectors 124. In the illustrated implementation, some of electrical connectors 124 carry an electrical current to the logic components 114 and 116 of the core logic 110 while other ones of electrical connectors 124 carry an electrical current from the logic components 114 and 116 of the core logic 110. At least one electrical connector 124 may carry an electrical current to the secondary device(s) 112 and at least one other electrical connector 124 may carry an electrical current from the secondary device (s) 112. And some of the electrical connectors 124 carry input/output (I/O) signals between the semiconductor chip 102 and the package substrate 104.

In some embodiments, the electrical connectors 124 are arranged in a grid or other pattern. In such embodiments, some, or all, of the electrical connectors 124 proximal to a periphery of the grid or other pattern may carry I/O signals between the semiconductor chip 102 and the package substrate 104. However, in the same or different embodiments, some of the electrical connectors 124 proximal to the periphery of the grid or other pattern may carry I/O signals, and other electrical connectors 124 proximal to the periphery of the grid or other pattern may carry electrical power between the semiconductor chip 102 and the package substrate 104.

In some embodiments in which the electrical connectors 124 are arranged in a grid or other pattern, some, or all, of the electrical connectors 124 that are not proximal to the periphery of the grid or other pattern may carry electrical power between the logic components 114 and 116 of the core logic 110 and the package substrate 104.

A plurality of electrical connectors 126 extend outward from the build-up layers 122. The electrical connectors 126 may be solder bumps, gold bumps, silver bumps, copper bumps, or other suitable material that is known for electrical conductive properties, for connecting the semiconductor package 100 to a board.

Figure 2:
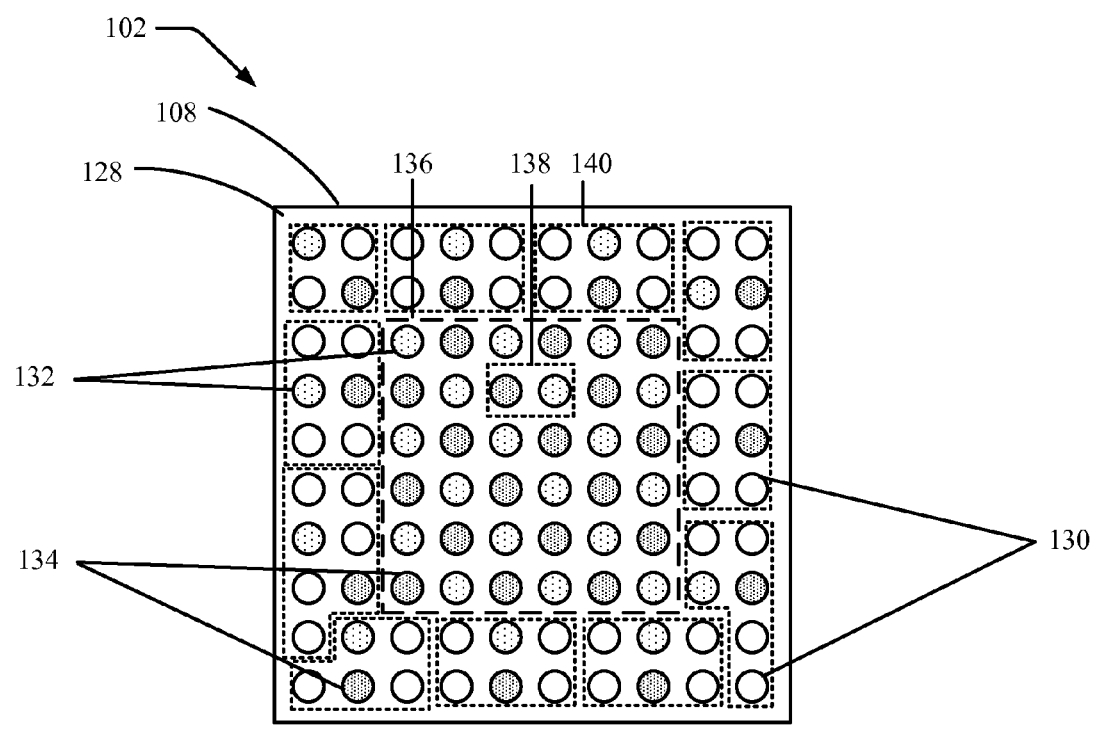
FIG. 2 shows a surface of a semiconductor die of FIG. 1.

FIG. 2 illustrates an outer surface 128 of the build-up layers 108 of the semiconductor chip 102. The surface 128 includes a plurality of pads 130-134, which may be aluminum (Al), aluminum-copper alloy, copper (Cu), or nickel (Ni), gold (Au), silver (Ag), or another suitable material that is known for electrical conductive properties. The pads 130-134 may have a pitch in the range of 50 microns to 200 microns and are formed and shaped to couple to the electrical connectors 124. In the illustrated embodiment, the pads 130-134 are shown as being arranged in a grid pattern. However, in other embodiments, the pads 130-134 may be arranged in other patterns.

Pads 130 may be input/output (I/O) signal pads; pads 132 may be input-power pads; and pads 134 may be output-power pads. I/O signal pads 130 may carry electrical signals to/from the core logic 110. Input-power pads 132 may receive electrical current from the package substrate 104, and output-power pads 134 may return electrical current to the package substrate 104.

Dashed line 136 represents a boundary between pads 132 and 134 that provide electrical power to the core logic 110 and those pads 130-134 that do not provide power to the core logic 110. Pads 132-134 that are circumscribed by the dashed line 136 are referred to collectively herein as core logic power pads or as core logic input-power and output-power pads. In the illustrated embodiment, there are an equal number of input-power pads 132 and output-power pads 134. Dashed line 138 illustrates a pair of core logic input-power and output-power pads 132, 134 that may used to form input and output power couplings to one or more devices or circuits or logic components of the core logic 110.

The semiconductor chip 102 may include one, or more, local redistribution layer(s) (RDLs). A local RDL layer has dimensions that are much smaller than a conventional RDL layer in a conventional semiconductor die. For example, a local RDL layer may have dimensions that are on the order of the pitch of the pads 130-134. For example, a local RDL layer may have a surface area with dimensions that are between 1p×1p to 5p×5p, where p=pitch. Local RDL layers may be electrically coupled to secondary device(s) 112 (such as those shown in FIG. 1). In some embodiments, the core logic 110 may include one or more local RDL layer(s), where a local RDL layer has dimensions that are approximately on the order of the pitch of the pads 108.

Dashed line 140 shows pads 130-134 that may be serviced by a local RDL layer. For example, there may be one or more secondary devices 112 that receive electrical current via input-power pad 132 and a first local RDL layer. The one or more secondary devices 112 may be, among other things, electrostatic protection devices that protect the I/O pads 130. The one or more secondary devices 112 may be electrically coupled to a second local RDL layer, and electrical current may be returned via the output-power pad 134 and the second local RDL layer.

However, in some embodiments, the semiconductor chip 102 is free of redistribution (RDL) layer(s). In other embodiments, the core logic 110 is free of redistribution (RDL) layer(s) while regions outside of the core logic 110 may include one or more RDL layers.

The core logic 110 may be powered entirely by electrical power carried by core logic input-power and output-power pads 132 and 134. Each pair of input-power and output-power pads 132 and 134 need only carry a fraction of the total electrical current required by the core logic 110. For example, if the core logic 110 requires X amps (e.g., 1.8 amps) and there are Y (18) pairs of core logic input-power and output-power pads 132 and 134, then each pair of core logic input-power and output-power pads 132 and 134 might carry, on average, only X/Y amps (100 mA).

Figure 3:
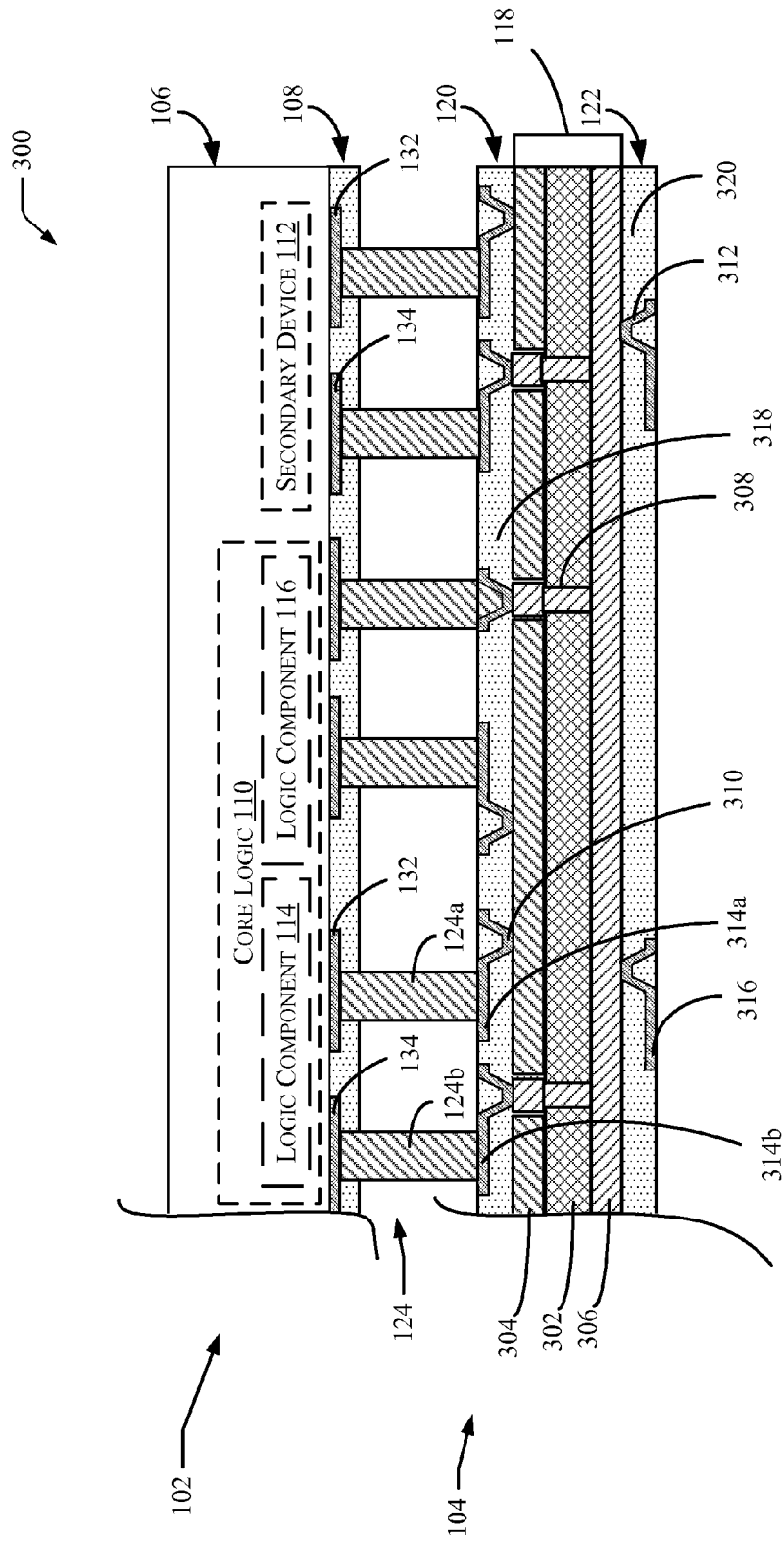
FIG. 3 schematically illustrates a cross sectional view of a semiconductor package.

FIG. 3 schematically illustrates a side view of a portion of a semiconductor package 300 that includes a semiconductor chip 102 and a package substrate 104 that are electrically coupled by a plurality of electrical connectors 124.

The substrate core 118 of the package substrate 104 includes a dielectric substrate 302 and a first metal layer 304 and a second metal layer 306. The dielectric substrate 302 may be comprised of, for example, a glass-fiber reinforced epoxy or the like, e.g., a printed circuit board. The first and second metal layers 304 and 306 may be of a material such as aluminum (Al), aluminum-copper alloy, copper (Cu), or nickel (Ni) or another suitable material that is known for electrical conductive properties. One or both of the first and the second metal layers 304 and 306, respectively, may serve as a redistribution layer (RDL). For example, the first metal layer 304 may provide VDD and the second metal layer 306 may provide ground (GND). The first metal layer 304 and the second metal layer 306 may have a thickness of approximately 2-10 microns. The thicknesses of the first metal layer 304 and the second metal layer 306 may be substantially greater (e.g., 3-10 times) than RDL layers in conventional semiconductor dies.

A plurality of through vias 308 may be formed in the substrate core 118. Openings for the through vias 308 may be drilled, laser drilled, and/or machined through the dielectric substrate 302. The through vias 308 permit current to flow between the second metal layer 306 of the substrate core 118 and the build-up layer 120. The first metal layer 304 and the second metal layer 306 may also be patterned to form device features such as, for example, traces, and a plurality of lines.

A number of device features can be formed in the build-up layers 120 and 122. The device features can include, for example, bondable traces, a plurality of lines, a plurality of vias 310 and 312, and a plurality of contact pads 314 and 316. The vias 310 may be electrically coupled to the contact pads 314 and may extend to the first metal layer 304 or to the through vias 308. Similarly, the vias 312 may be electrically coupled to the contact pads 316 and may extend to the second metal layer 306. As shown, the vias 310 and 312 serve as connectors in the build-up layer 120 and the build-up layer 122, respectively, and allow a conductive connection between different layers of the substrate core 118 and external sources such as the semiconductor die 102. Openings for the vias 310 and 312 may be machined, drilled, laser drilled or etched in dielectric layers 318 and 320 of the build-up layers 120 and 122, respectively.

In one implementation, the first metal layer 304 of the package substrate 104 is a power plane such as a VDD plane, and the second metal layer 306 of the package substrate 104 is a ground plane.

The semiconductor chip 102 may include logic components 114 and 116. Each one of the logic components 114 and 116 is electrically coupled to a pair of core logic input-power and output-power pads 132 and 134. Electrical connectors 124a extend between core logic input-power pads 132 and contact pads 314a, and electrical connectors 124b extend between core logic output-power pads 134 and contact pads 314b.

Thus, each one of the logic components 114 and 116 is electrically coupled to the power plane (first metal layer 304) and the ground plane (second metal layer 306) of the package substrate 104.

The roles of the first metal layer 304 and the second metal layer 306 may be reversed such that the first metal layer 304 is the ground plane and the second metal layer 306 is the VDD plane. Thus, the roles of the pairs of core logic input-power and output-power pads 132 and 134 would be similarly reversed.

In some implementations, the semiconductor chip 102 does not include a ground plane and/or a VDD plane.

The exemplary package substrate 104 discussed above may be referred to as a 1/2/1 package substrate having one build-up layer (build-up layer 120) on a first side of the substrate core 118, two metal layers (first metal layer 304 and second metal layer 306) in the substrate core 118, and one build-up layer (build-up layer 122) on a second side of the substrate core 118. However, in other implementations, a package substrate may be configured as a 1/4/1 (build-up layer/four metal layers/build-up layer) and/or as a 2/4/2 (two build-up layers/four metal layers/two build-up layers).

In some implementations, the build-up layer 120 and/or the build-up layer 122 may include multiple build-up layers.

Similarly, in some implementations, the substrate core 118 may be comprised of multiple dielectric substrates and more than two metal layers.

The description may use perspective-based descriptions such as over/under. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A semiconductor package comprising:
   a plurality of electrical connectors;
   a semiconductor die having core logic, at least two pairs of core logic input-power and output-power pads that provide power to the core logic, and a plurality of input/output signal pads that carry signals to and from the core logic, wherein each core logic input-power pad and core logic output-power pad, and each input signal pad and output signal pad, has an electrical connector of the plurality of electrical connectors extending therefrom; and
   a package substrate configured to provide power to the core logic of the semiconductor die and having at least two pairs of input-power and output-power contact pads, a plurality of input/output signal contact pads, a first metal redistribution layer, and a second metal redistribution layer, the first metal redistribution layer providing a first electrical potential to each of the input-power contact pads, the second metal redistribution layer providing a second electrical potential to each of the output-power contact pads, wherein each contact pad has an electrical connector of the plurality of electrical connectors extending therefrom.

2. The semiconductor package of claim 1, wherein each core logic input-power pad receives the first electrical potential via the respective electrical connector extending therefrom to the corresponding input-power contact pads of the package substrate, and each core logic output-power pad receives the second electrical potential via the respective electrical connector extending therefrom to the corresponding output-power contact pads of the package substrate.

3. The semiconductor package of claim 2, wherein the first electrical potential of the first metal redistribution layer is higher than the second electrical potential of the second metal redistribution layer.

4. The semiconductor package of claim 1, wherein the core logic of the semiconductor die is free of a metal redistribution layer.

5. The semiconductor package of claim 1, wherein the semiconductor die is free of a metal redistribution layer.

6. The semiconductor package of claim 1, wherein the core logic includes a first logic component and a second logic component, wherein the first logic component is powered by a first pair of core logic input-power and output-power pads of the at least two pairs of core logic input-power and output-power pads, and the second logic component is powered by a second pair of core logic input-power and output-power pads of the at least two pairs of core logic input-power and output-power pads.

7. The semiconductor package of claim 1, wherein:

the semiconductor die includes at least one electrostatic protection device and at least one pair of input-power and output-power pads, wherein the electrostatic protection device is powered by the at least one pair of input-power and output-power pads, wherein each power pad of the at least one pair of input-power and output-power pads has an electrical connector of the plurality of electrical connectors extending therefrom, the input-power pad having the first electrical potential applied thereto, the output-power pad having the second electrical potential applied thereto.

* * * * *